(12) United States Patent
Tan et al.

(10) Patent No.: US 11,502,127 B2
(45) Date of Patent: Nov. 15, 2022

(54) SEMICONDUCTOR MEMORY DEVICES

(71) Applicant: GLOBALFOUNDRIES Singapore Pte. Ltd., Singapore (SG)

(72) Inventors: Shyue Seng Tan, Singapore (SG); Xinshu Cai, Singapore (SG); Eng Huat Toh, Singapore (SG)

(73) Assignee: GlobalFoundries Singapore Pte. Ltd., Singapore (SG)

(*) Notice: Subject to any disclaimer, the term of this patent is extended or adjusted under 35 U.S.C. 154(b) by 72 days.

(21) Appl. No.: 17/135,968

(22) Filed: Dec. 28, 2020

(65) Prior Publication Data

US 2022/0208856 A1 Jun. 30, 2022

(51) Int. Cl.
| | |
|---|---|
| H01L 27/24 | (2006.01) |
| H01L 45/00 | (2006.01) |
| H01L 29/786 | (2006.01) |
| H01L 29/66 | (2006.01) |

(52) U.S. Cl.
CPC .... *H01L 27/2436* (2013.01); *H01L 29/66765* (2013.01); *H01L 29/66969* (2013.01); *H01L 29/7869* (2013.01); *H01L 29/78648* (2013.01); *H01L 29/78669* (2013.01); *H01L 29/78696* (2013.01); *H01L 45/16* (2013.01)

(58) Field of Classification Search
CPC ........... H01L 27/2436; H01L 29/66765; H01L 29/66969; H01L 29/78648; H01L 29/78669; H01L 29/7869; H01L 29/78696; H01L 45/16
USPC .......................................................... 257/5
See application file for complete search history.

(56) References Cited

U.S. PATENT DOCUMENTS

| | | | |
|---|---|---|---|
| 2012/0112191 A1* | 5/2012 | Kato | H01L 27/1225 257/E29.083 |
| 2020/0266289 A1* | 8/2020 | Yamazaki | H01L 21/02323 |
| 2021/0020834 A1 | 1/2021 | Loy et al. | |
| 2021/0376235 A1 | 12/2021 | Loy et al. | |

OTHER PUBLICATIONS

Jixuan Wu et al., A Monolithic 3D Integration of RRAM Array with Oxide Semiconductor FET for In-memory Computing in Quantized Neural Network AI Applications, 2020 IEEE Symposium on VLSI Technology, 2020, pp. 1-2. IEEE.

* cited by examiner

*Primary Examiner* — Tong-Ho Kim
(74) *Attorney, Agent, or Firm* — David Cain

(57) ABSTRACT

The embodiments herein relate to semiconductor memory devices and methods of forming the same. A semiconductor memory device is provided. The semiconductor memory device includes a dual-gate transistor and a memory cell. The memory cell is adjacent to the dual-gate transistor, wherein the memory cell and the dual-gate transistor share a common electrode.

20 Claims, 5 Drawing Sheets

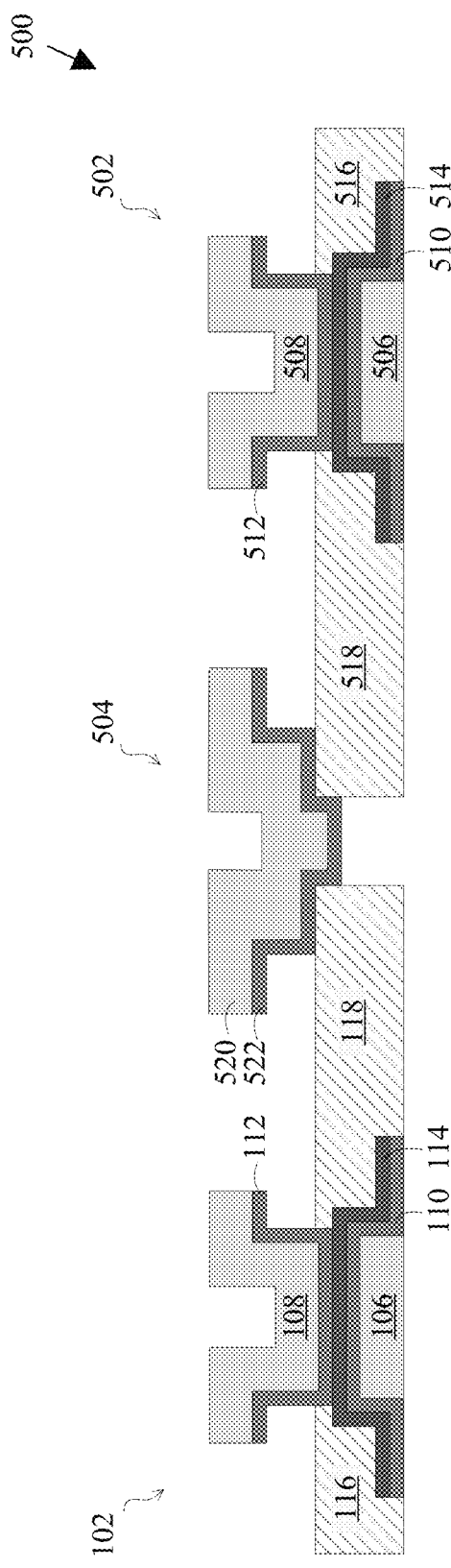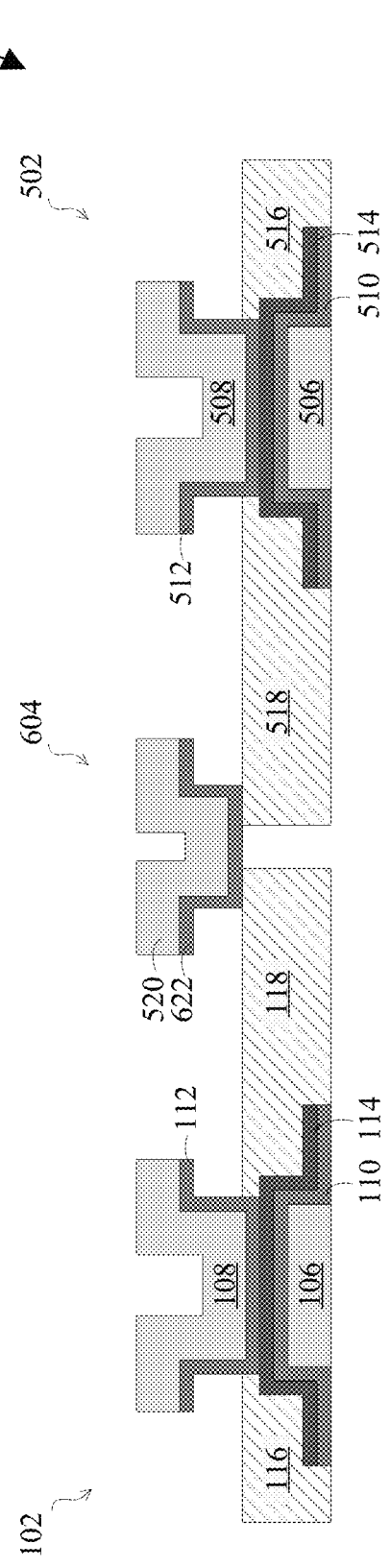

SEMICONDUCTOR MEMORY DEVICES

TECHNICAL FIELD

The present disclosure relates generally to semiconductor devices, and more particularly to semiconductor memory devices and methods of forming the same.

BACKGROUND

Semiconductor memory devices can be generally split into volatile memory devices and non-volatile memory (NVM) devices. Resistive random-access memory (RRAM) device is a type of non-volatile memory (NVM) devices for use in advanced computing systems, such as for processing-in-memory (PIM) applications and machine learning (ML) applications using binary neural network (BNN)-based techniques. RRAM devices are suitable for such applications as they can provide high-density architecture with high parallel programming speed and low power consumption.

However, memory devices may present challenges such as susceptibility to process variation and high latency in programming speed. A high-density array of memory devices may be required to increase the accuracy of ML algorithms, which occupies valuable real estate on a semiconductor chip.

Therefore, it is desirable to provide memory devices having improved device performance with smaller footprints and methods of forming the same to overcome, or at least ameliorate, the disadvantages described above.

SUMMARY

To achieve the foregoing and other aspects of the present disclosure, semiconductor memory devices and methods of forming the same are presented.

According to an aspect of the present disclosure, a semiconductor memory device is provided. The semiconductor memory device includes a dual-gate transistor and a memory cell adjacent to the dual-gate transistor. The memory cell and the dual-gate transistor share a common electrode.

According to another aspect of the present disclosure, a semiconductor memory device is provided. The semiconductor memory device includes a dual-gate transistor and a memory cell adjacent to the dual-gate transistor. The memory cell further includes a first memory electrode, a switching layer coupled to the first memory electrode, and a second memory electrode coupled to the switching layer. The first memory electrode is a drain electrode of the dual-gate transistor.

According to yet another aspect of the present disclosure, a method of forming a semiconductor memory device is provided. The method includes forming a dual-gate transistor and forming a memory cell adjacent to the dual-gate transistor. The dual-gate transistor is formed by forming a gate electrode stack having a first gate electrode and a second gate electrode over the first gate electrode. The memory cell is formed by forming a first memory electrode and a second memory electrode adjacent to the dual-gate transistor. The memory cell is formed coupled to the dual-gate transistor through a first memory electrode of the memory cell.

BRIEF DESCRIPTION OF THE DRAWINGS

The embodiments of the present disclosure will be better understood from a reading of the following detailed description, taken in conjunction with the accompanying drawings:

FIGS. 1A to 1C are enlarged views corresponding to the various regions of the semiconductor memory device in FIG. 1, according to an embodiment of the disclosure.

FIG. 5 is a cross-sectional view of a semiconductor memory device, according to an alternative embodiment of the disclosure.

FIG. 6 is a cross-sectional view of a semiconductor memory device, according to an alternative embodiment of the disclosure.

Figure 1:
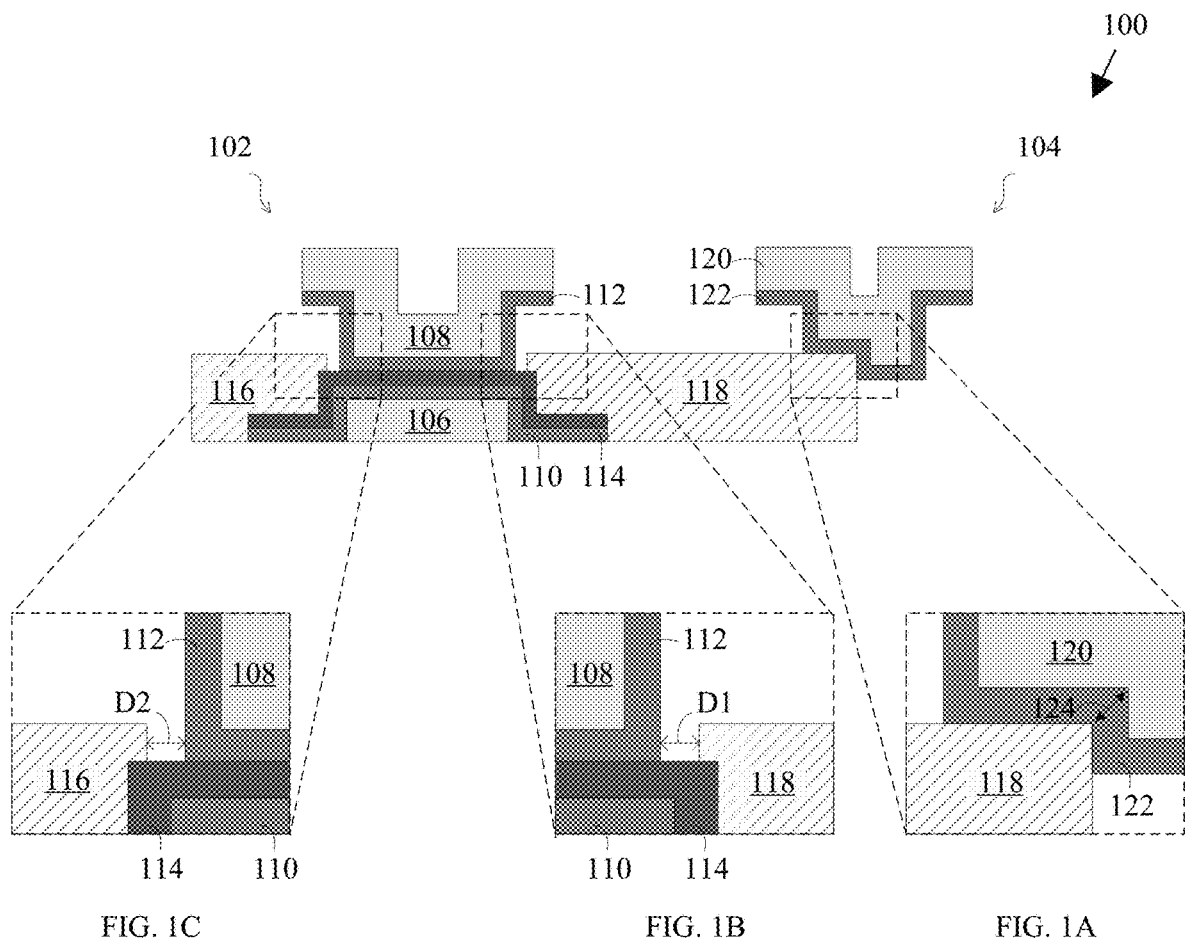
FIG. 1 is a cross-sectional view of a semiconductor memory device, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the device.

Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements.

DETAILED DESCRIPTION

The present disclosure relates generally to semiconductor devices, and more particularly to semiconductor memory devices and methods of forming the same. The semiconductor memory devices have improved device performance with smaller footprints.

A resistive random-access memory (RRAM) cell generally includes a pair of memory electrodes and a switching layer interposed between the pair of memory electrodes. The switching layer of the RRAM cell is normally insulating.

The RRAM cell operates by switching between states based on the resistance of the switching layer. For example, upon application of a sufficiently high voltage difference between the two memory electrodes, a dielectric breakdown event may occur and one or more conducting filaments may be formed within the switching layer. The switching layer becomes conductive with the formation of one or more conducting filaments. The switching layer may revert to the insulating state by applying a sufficiently low voltage difference between the two memory electrodes to break the one or more conducting filaments.

When the switching layer is insulative, the switching layer has a relatively high resistance and the RRAM cell may be referred to as being in a high-resistance state (HRS). When the switching layer is conductive, the switching layer has a relatively low resistance and the RRAM cell may be referred to as being in a low-resistance state (LRS). To set the RRAM cell, the RRAM cell is switched from the FIRS to the LRS. To reset the RRAM cell, the RRAM cell is switched from the LRS to the HRS.

Various embodiments of the present disclosure are now described in detail with accompanying drawings. It is noted that like and corresponding elements are referred to by the use of the same reference numerals. The embodiments disclosed herein are exemplary, and not intended to be exhaustive or limiting to the disclosure.

FIG. 1 is a cross-sectional view of a semiconductor memory device 100, according to an embodiment of the disclosure. FIGS. 1A, 1B, and 1C are enlarged views corresponding to various regions of the memory device 100 as depicted by the dotted lines. The memory device 100 may be arranged in a memory cell region of a semiconductor device and the memory device 100 may be part of a plurality of memory devices arranged in an array configuration of rows and columns in the memory cell region. Only one memory device is illustrated for clarity purposes. The memory device 100 may include a transistor 102 and an RRAM cell 104 adjacent to the transistor 102.

The RRAM cell 104 may be coupled to the transistor 102. It will be understood that when an element is referred to as being "connected" or "coupled" to another element, the element can be directly connected or coupled to the other element or intervening elements may be present. In contrast, when an element is referred to as being "directly connected" or "directly coupled" to another element, there are no intervening elements present.

The transistor 102 may be a dual-gate transistor including a gate electrode stack having a first gate electrode 106 and a second gate electrode 108 overlying the first gate electrode 106. In an embodiment of the disclosure, the first and second gate electrodes 106, 108 may include a conducting material such as, but not limited to, tantalum, hafnium, copper, silver, cobalt, tungsten, combinations thereof, or other conducting materials known to those skilled in the art. In another embodiment of the disclosure, the first and second gate electrodes 106, 108 may include a bilayer stack of conducting materials such as, but not limited to, titanium/titanium nitride or the like. In yet further embodiment of the disclosure, the first and second gate electrodes 106, 108 may have a thickness in a range of 5 to 30 nm. It is understood that the first and second gate electrodes 106, 108 may not necessarily be formed of the same conducting material or have the same thickness, even though FIG. 1 illustrates them as such.

The transistor 102 may further include a first gate dielectric layer 110 and a second gate dielectric layer 112. The first and second gate dielectric layers 110, 112 may be arranged between the first and second gate electrodes 106, 108 such that the first gate dielectric layer 110 overlays the first gate electrode 106 and the second gate dielectric layer 112 underlays the second gate electrode 108. The second gate dielectric layer 112 may further conform to a lower surface of the second gate electrode 108. In an embodiment of the disclosure, the first and second gate dielectric layers 110, 112 may include a dielectric material such as, but not limited to, tantalum oxide, hafnium oxide, aluminum oxide, silicon oxide, combinations thereof, or other dielectric materials known to those skilled in the art. In another embodiment of the disclosure, the first and second gate dielectric layers 110, 112 may have a thickness in a range of 2 to 10 nm. It is understood that the first and second gate dielectric layers 110, 112 may not necessarily be formed of the same dielectric material or have the same thickness, even though FIG. 1 illustrates them as such.

The transistor 102 may yet further include a channel layer 114 interposed between the first and second gate dielectric layers 110, 112. The channel layer 114 may conformally overlay the first gate dielectric layer 110. In an embodiment of the disclosure, the channel layer 114 may include an oxide semiconducting material, such as but not limited to, zinc oxide, cadmium oxide, indium oxide, indium gallium zinc oxide (IGZO), combinations thereof, or other oxide semiconducting materials known to those skilled in the art. In another embodiment of the disclosure, the channel layer 114 may include amorphous silicon. In yet another embodiment of the disclosure, the channel layer 114 may have a thickness in a range of 3 to 20 nm.

The transistor 102 may include a source electrode 116 and a drain electrode 118. The source electrode 116 may be arranged adjacent to a first side of the gate electrode stack and the drain electrode 118 may be arranged adjacent to a second side of the gate electrode stack, wherein the gate electrode stack includes the first and second gate electrodes 106, 108 and the second side is laterally opposite the first side. The source and drain electrodes 116, 118 may further be arranged over portions of the channel layer 114.

In an embodiment of the disclosure, the source and drain electrodes 116, 118 may have lower surfaces substantially coplanar with a lowermost surface of the first gate dielectric layer 110. In another embodiment of the disclosure, the source and drain electrodes 116, 118 may include a conducting material such as, but not limited to, ruthenium, platinum, titanium nitride, tantalum nitride, combinations thereof, or other conducting materials known to those skilled in the art. In another embodiment of the disclosure, the source and drain electrodes 116, 118 may have a thickness in a range of 5 to 10 nm. It is understood that the source and drain electrodes 116, 118 may not necessarily be formed of the same conducting material or have the same thickness, even though FIG. 1 illustrates them as such.

The RRAM cell 104 may be adjacent to the transistor 102; in particular, the RRAM cell 104 may be arranged at the second side of the gate electrode stack such that the drain electrode 118 of the transistor 102 is a common electrode shared with the RRAM cell 104. In an embodiment of the disclosure, the drain electrode 118 of the transistor 102 is a first memory electrode 118 for the RRAM cell 104. Accordingly, the drain electrode 118 of the transistor 102 and the first memory electrode 118 of the RRAM cell 104 refer to the same feature and are denoted with the same reference numeral 118. Thus, the terms "drain electrode" and "first memory electrode" are used interchangeably in this present disclosure. For example, the term "drain electrode" is used with reference to the transistor and the term "first memory electrode" is used with reference to the RRAM cell. The first memory electrode may also be referred to as a bottom memory electrode.

The RRAM cell 104 may further include a second memory electrode 120 and a switching layer 122. The second memory electrode 120 and the switching layer 122 may overlay at least a portion of the first memory electrode 118. As illustrated in FIG. 1, the switching layer 122 may include a first portion overlying and in contact with an upper surface portion of the first memory electrode 118 and a second portion overlying and in contact with a sidewall portion of the first memory electrode 118. In an embodiment of the disclosure, the switching layer 122 has a lowermost surface below an upper surface of the first memory electrode 118. In another embodiment of the disclosure, the switching layer 122 may have an uppermost surface substantially coplanar with an uppermost surface of the second gate dielectric layer 112. In yet another embodiment of the disclosure, the switching layer 122 may include substantially sharp corners. For example, an angle between the first and second portions may range from about 85 degrees to 95 degrees.

The second memory electrode 120 may conformally overlay the switching layer 122. The second memory electrode 120 may also be referred to as a top memory electrode. In an embodiment of the disclosure, the second memory electrode 120 may have an uppermost surface substantially coplanar with an uppermost surface of the second gate electrode 108. In another embodiment of the disclosure, the second memory electrode 120 may include a conducting material such as, but not limited to, tantalum, hafnium, copper, silver, cobalt, tungsten, combinations thereof, or other conducting materials known to those skilled in the art. In another embodiment of the disclosure, the second memory electrode 120 may include a bilayer stack of conducting materials such as, but not limited to, titanium/titanium nitride or the like. In yet another embodiment of the disclosure, the second memory electrode 120 may have a thickness in a range of 5 to 30 nm.

It will be appreciated that the second memory electrode 120 may include the same conducting material as the second gate electrode 108 of the transistor 102 for ease of fabrication. However, it is understood that the second memory electrode 120 and the second gate electrode 108 may not necessarily be formed of the same conducting material or have the same thickness, even though FIG. 1 illustrates them as such.

In an embodiment of the disclosure, the switching layer 122 may include a dielectric material such as, but not limited to, tantalum oxide, hafnium oxide, titanium oxide, aluminum oxide, silicon oxide, combinations thereof, or other dielectric materials known to those skilled in the art. The switching layer 122 may be configured with a thickness so that a relatively low voltage may be sufficient to switch the resistance of the switching layer 122. The voltage required for the operation of the RRAM cell 104 may further vary with the technology node and the type of memory devices fabricated. In an embodiment of the disclosure, the switching layer 122 may have a thickness in a range of 2 to 10 nm.

It will be appreciated that the switching layer 122 may include the same dielectric material as the second gate dielectric layer 112 of the transistor 102 for ease of fabrication. However, it is understood that the switching layer 122 and the second gate dielectric layer 112 may not necessarily be formed of the same dielectric material or have the same thickness, even though FIG. 1 illustrates them as such.

The transistor 102 may be an access transistor to drive the RRAM cell 104 and may be arranged in a back-end-of-line (BEOL) region of the semiconductor device. The transistor 102, being in the BEOL region, enables shorter wiring to the RRAM cell 104, thereby advantageously reduces latency in the programming speed of the memory device 100.

FIG. 1A illustrates a filament formation region in the switching layer 122 of the semiconductor memory device 100, according to an embodiment of the disclosure. The RRAM cell 104 may be set by effectuating the second memory electrode 120 to a voltage level higher than the first memory electrode 118 to switch the state of the switching layer 122 from a HRS state to a LRS state. For example, a sufficiently high voltage may be applied to the second memory electrode 120. Electric fields may be generated in regions where the switching layer 122 is in contact with the first memory electrode 118 and one or more conducting paths formed by one or more conducting filaments 124 may be formed in the switching layer 122.

The RRAM cell 104 may be reset by effectuating the first memory electrode 118 to a voltage level higher than the second memory electrode 120 to break the one or more conducting filaments 124 in the switching layer 122, i.e., switching the state of the switching layer 122 from a LRS state to a HRS state (non-conducting). For example, a sufficiently high voltage may be applied to the source electrode 116, the first gate electrode 106, and/or the second gate electrode 108 to bias the voltage level of the drain electrode 118 to a voltage level higher than the second memory electrode 120. In another example, a negative voltage may be applied to the second memory electrode 120 such that the second memory electrode 120 is at a voltage level lower than the first memory electrode 118.

As illustrated in FIG. 1A, the conducting filaments 124 may be formed in a junction/corner between the first and second portions of the switching layer 122 that are in contact with the first memory electrode 118. As the electric fields formed around the junction/corner of the first memory electrode 118 are stronger than that of non-corner regions, the conducting filaments 124 may be substantially confined in the switching layer 122 at the junction/corner. It is beneficial to minimize the variability of locations where the conducting filaments 124 are formed as the confinement reduces the stochasticity of the conducting filaments 124, which in turn reduces the variability of the switching layer 122 in the HRS state. Uncontrolled distribution of the conducting filaments 124 can lead to undesirable process variations such as high device-to-device variability and cycle-to-cycle variability.

FIGS. 1B and 1C illustrate the drain electrode 118 being separated from the second gate dielectric layer 112 with a distance D1 and the source electrode 116 being separated from the second gate dielectric layer 112 with a distance D2, respectively, according to an embodiment of the disclosure. It is understood that the separation distances D1 and D2 may not necessarily the same, even though FIG. 1 illustrates them as such.

The second dielectric layer 112 and the switching layer 122 are dielectric layers predominantly having similar material properties. When setting the RRAM cell 104, one or more conducting paths may be undesirably formed in the second dielectric layer 112. By forming the source and drain electrodes 116, 118 separated from the second gate dielectric layer 112, the possibility of forming a conductive path in the second gate dielectric layer 112 is advantageously minimized.

FIGS. 2A to 2D are cross-sectional views that illustrate a method of forming the semiconductor memory device 100 in FIG. 1, according to an embodiment of the disclosure. Certain structures may be conventionally fabricated, for example, using known processes and techniques, and specifically disclosed processes and methods may be used to achieve individual aspects of the present disclosure.

As used herein, "deposition techniques" refer to the process of applying a material over another material (or the substrate). Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), or atomic layer deposition (ALD).

Additionally, "patterning techniques" includes deposition of material or photoresist, patterning, exposure, development, etching, cleaning, and/or removal of the material or photoresist as required in forming a described pattern, structure, or opening. Exemplary examples of techniques for patterning include, but not limited to, wet etch lithographic processes, dry etch lithographic processes, or direct patterning processes. Such techniques may use mask sets and mask layers with dopants having a desired conductivity type.

Figure 2A:
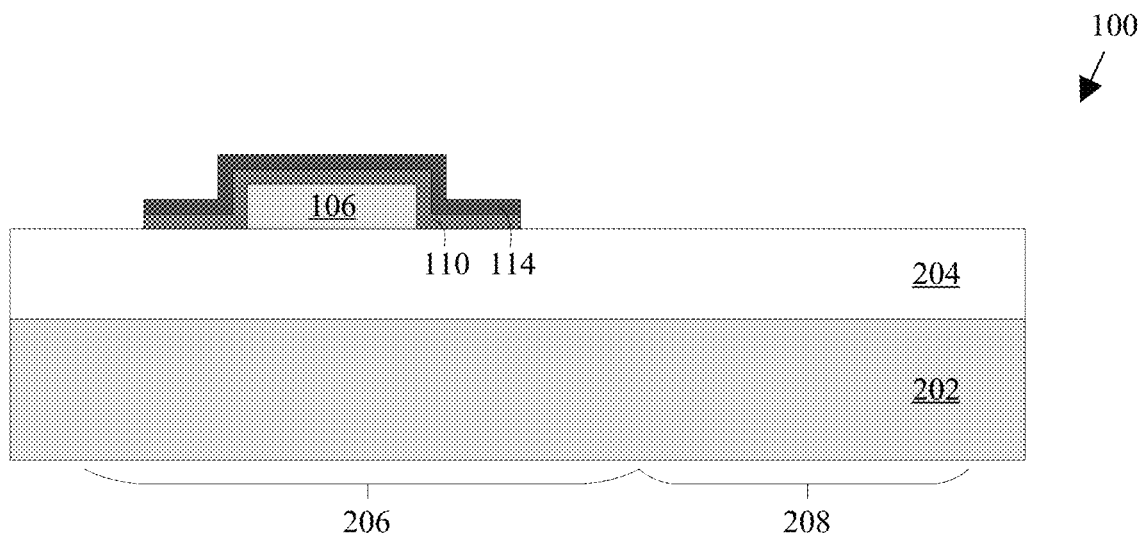
FIGS. 2A to 2D are cross-sectional views that illustrate a method of forming the semiconductor memory device in FIG. 1, according to an embodiment of the disclosure.

FIG. 2A illustrates the memory device 100 including a substrate 202 and a first dielectric layer 204 over the substrate 202, according to an embodiment of the disclosure. The memory device 100 may further include a first region 206 defined to form a transistor and a second region 208 defined to form an RRAM cell.

A conductive material may be deposited over the first dielectric layer 204 in the first and second regions 206, 208 using a deposition technique. The conductive material may be patterned to form a first gate electrode 106 using a patterning technique in the first region 206.

A layer of dielectric material and a layer of oxide semiconducting material may be sequentially deposited over the first gate electrode 106 and the first dielectric layer 204 using various deposition techniques. In an embodiment of the disclosure, the layer of dielectric material and the layer of oxide semiconducting material may be deposited using an ALD process to conformally deposit thereupon the first gate electrode 106 and the first dielectric layer 204. The layer of dielectric material and the layer of oxide semiconducting material may be patterned to form a first gate dielectric layer 110 and a channel layer 114 using various patterning techniques.

The first gate dielectric layer 110 and the channel layer 114 may overlay the first gate electrode 106 and may extend away from the first gate electrode 106 such that the first gate dielectric layer 110 may be in contact with an upper surface of the first dielectric layer 204. The first gate dielectric layer 110 and the channel layer 114 may be confined within the first region 206 of the memory device 100 and may not extend into the second region 208.

Figure 2B:
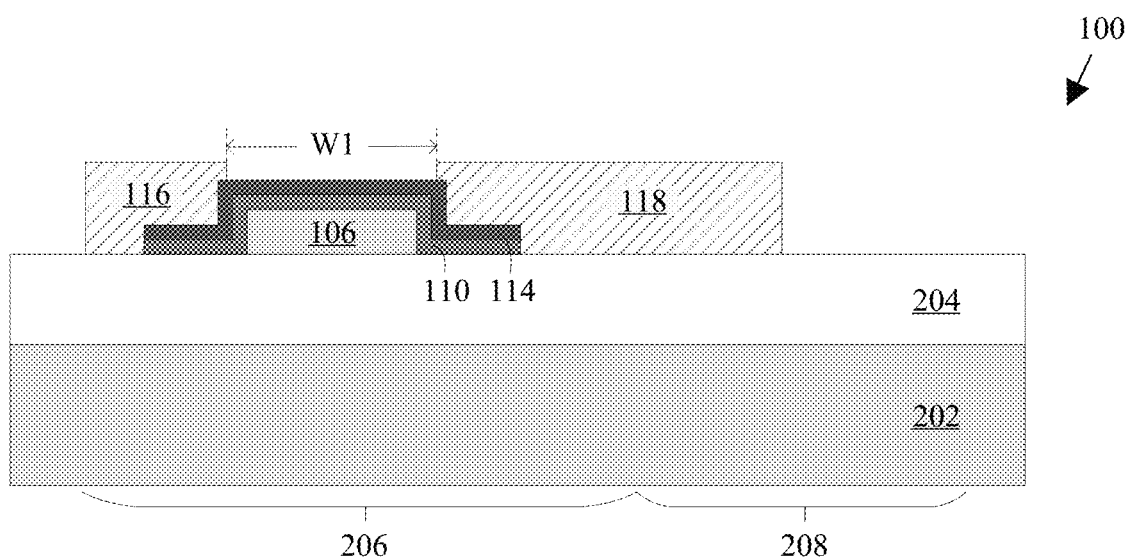

FIG. 2B illustrates the memory device 100 after forming a source electrode 116 and a drain electrode 118, according to an embodiment of the disclosure. A conducting material may be deposited over the channel layer 114 and the upper surface of the first dielectric layer 204 using a deposition technique. The conducting material may be patterned using a patterning technique to form the source electrode 116 adjacent to a first side of the first gate electrode 106 and the drain electrode 118 adjacent to a second side of the first gate electrode 106; the second side being laterally opposite the first side. The drain electrode 118 may extend into the second region 208 of the memory device 100.

It is understood that the source and drain electrodes 116, 118 are discrete electrodes and that a portion of an upper surface of the channel layer 114 may be exposed after forming the source and drain electrodes 116, 118. The portion of the channel layer 114 exposed between the source and drain electrodes 116, 118 has a width W1.

In an embodiment of the disclosure, the source and drain electrodes 116, 118 may have substantially coplanar upper surfaces. In another embodiment of the disclosure, the source and drain electrodes 116, 118 may have upper surfaces that are above the upper surface of the channel layer 114. In another embodiment of the disclosure, the source and drain electrodes 116, 118 may partially overlap the upper surface of the channel layer 114. In yet another embodiment of the disclosure, the source and drain electrodes 116, 118 may partially overlap the uppermost surface of the channel layer 114.

Figure 2C:
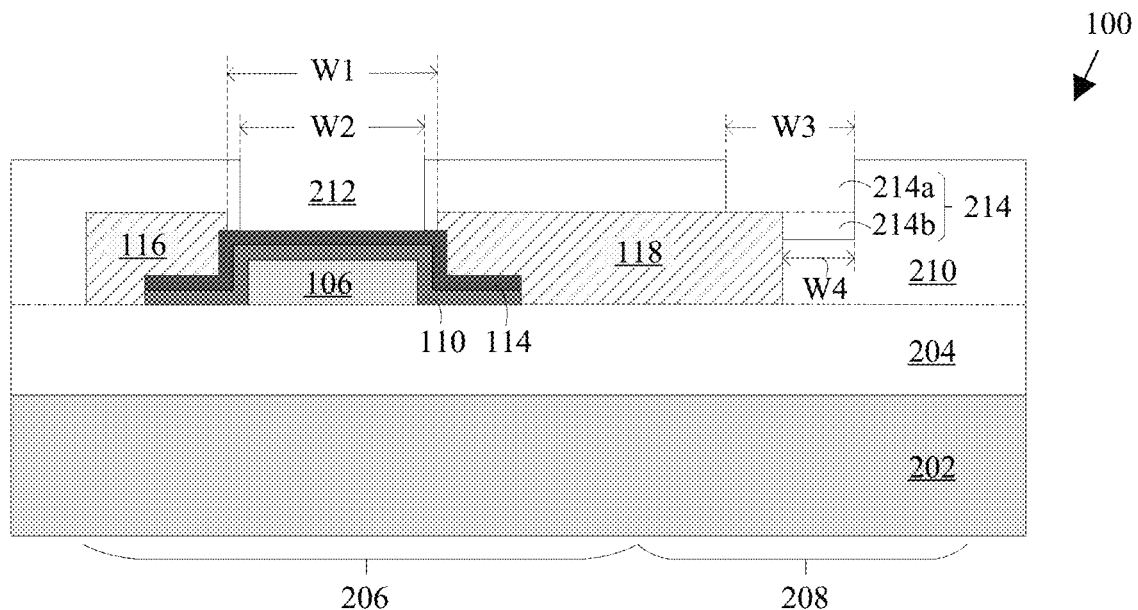

FIG. 2C illustrates the memory device 100 after forming a second dielectric layer 210, a first opening 212, and a second opening 214 in the second dielectric layer 210, according to an embodiment of the disclosure. The second dielectric layer 210 may be deposited over the first and second regions 206, 208 of the memory device 100; in particular over the first dielectric layer 204, the source and drain electrodes 116, 118, and the channel layer 114. The second dielectric layer 210 may be deposited using a deposition technique. The first and second openings 212, 214 may be formed using a patterning technique.

The first opening 212 may be formed in the second dielectric layer 210 at the first region 206 of the memory device 100 over the first gate electrode 106 between the source and drain electrodes 116, 118. The first opening 212 has a width W2 and exposes a portion of the uppermost surface of the channel layer 114 between the source and drain electrodes 116, 118. In an embodiment of the disclosure, the width W2 is narrower than the width W1 such that portions of the second dielectric layer 210 remains in contact with the channel layer 114 immediately adjacent to the source and drain electrodes 116, 118.

The second opening 214 may be formed in the second dielectric layer 210 in the second region 208 of the memory device 100. The second opening 214 may partially expose the drain electrode 118; in particular, an upper surface portion and a sidewall portion of the drain electrode 118. In an embodiment of the disclosure, the second opening 214 has a first region 214a having a width W3 and a second region 214b having a width W4; W4 being narrower than W3.

Figure 2D:
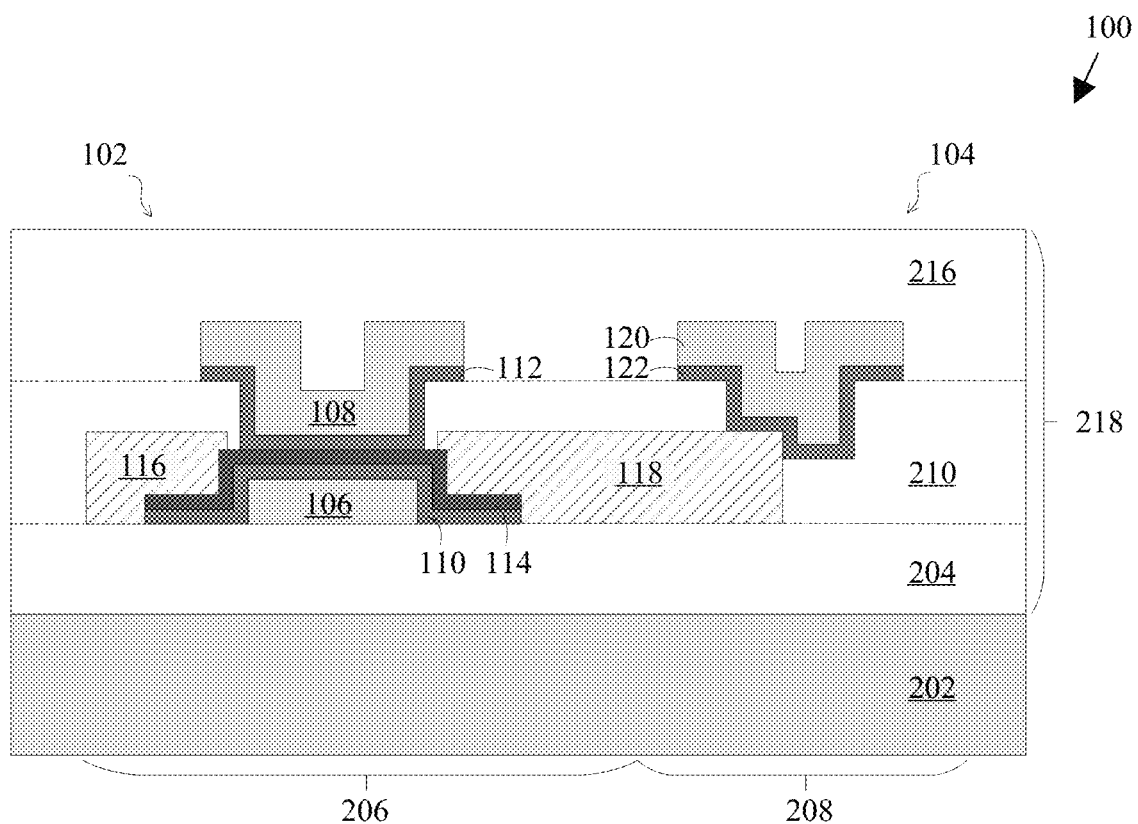

FIG. 2D illustrates the memory device 100 after forming the transistor 102 in the first region 206 and the RRAM cell 104 in the second region 208, according to an embodiment of the disclosure. A dielectric material may be deposited over the second dielectric layer 210 and in the first and second openings 212, 214. In an embodiment of the disclosure, the dielectric material may be conformally deposited with a deposition technique, such as an ALD process. A conducting material may be deposited over the dielectric material.

The dielectric material and the conducting material may be patterned using a patterning technique. The patterned dielectric material forms a second gate dielectric layer 112 of the transistor 102 and a switching layer 122 of the RRAM cell 104. The patterned conductive layer forms a second gate electrode 108 of the transistor 102 and the second memory electrode 120 of the RRAM cell 104.

It will be appreciated that the second gate dielectric layer 112, the switching layer 122, the second gate electrode 108, and the second memory electrode 120 may be patterned concurrently for ease of fabrication. However, it is understood that the second gate dielectric layer 112, the switching layer 122, the second gate electrode 108, and the second memory electrode 120 may be formed separately, without departing from the spirit or scope of the disclosure.

The second gate dielectric layer 112 may line the first opening 212 and may extend over an upper surface of the second dielectric layer 210 in the first region 206 of the memory device 100. The second gate electrode 108 may overlay the second gate dielectric layer 112 and may have a sidewall substantially coplanar with a sidewall of the second gate dielectric layer 112. The second gate electrode 108 may or may not completely fill the first opening 212 in the second dielectric layer 210.

The switching layer 122 may line the second opening 214 and may extend over the upper surface of the second dielectric layer 210 in the second region 208 of the memory device 100. The second memory electrode 120 may overlay the switching layer 122 and may have a sidewall substantially coplanar with a sidewall of the switching layer 122. The second memory electrode 120 may or may not completely fill the second opening 214 in the second dielectric layer 210.

A third dielectric layer 216 may be deposited over the transistor 102 and the RRAM cell 104 using a deposition technique. The first, second, and third dielectric layers 204, 210, 216 may be collectively referred to as an inter-layer dielectric (ILD) layer 218. The ILD layer 218 may include a dielectric material suitable to at least electrically isolate the memory device 100 from adjacent conductive structures. In an embodiment of the disclosure, the dielectric material may include, but not limited to, silicon dioxide, tetraethyl orthosilicate (TEOS), or other dielectric materials known to those skilled in the art.

Figure 3:
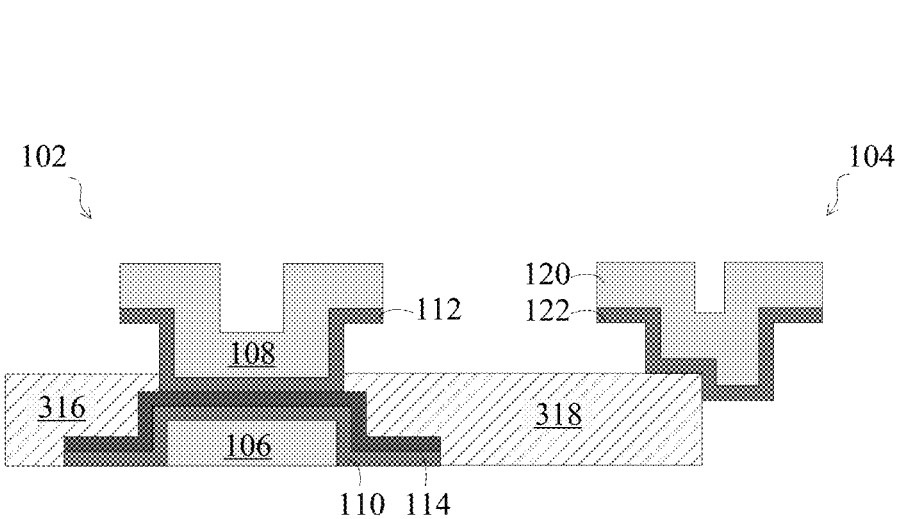
FIG. 3 is a cross-sectional view of a semiconductor memory device, according to an alternative embodiment of the disclosure.

FIG. 3 is a cross-sectional view of a semiconductor memory device 300, according to an alternative embodiment of the disclosure. The memory device 300 is similar to the memory device 100 in FIG. 1, and thus common features are labeled with the same reference numerals and need not be discussed. As illustrated in FIG. 3, instead of the source and drain electrodes 116, 118 being separated from the second gate dielectric layer 112, the memory device 300 may have a source electrode 316 and a drain electrode 318 in contact with the second gate dielectric layer 112. It should be appreciated that undesirable formation of a conductive path in the second gate dielectric layer 112 may be minimized through an optimization of electrical operation conditions of the memory device 300.

Figure 4:
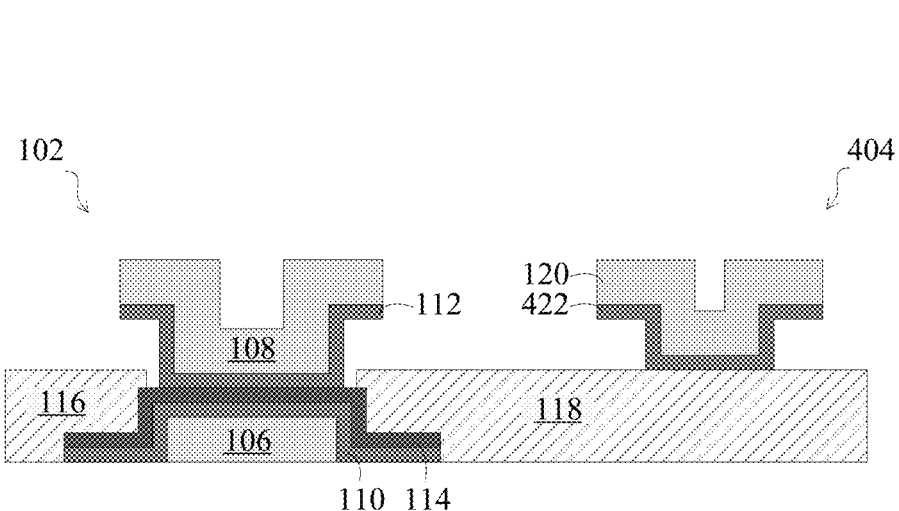
FIG. 4 is a cross-sectional view of a semiconductor memory device, according to an alternative embodiment of the disclosure.

FIG. 4 is a cross-sectional view of a semiconductor memory device 400, according to an alternative embodiment of the disclosure. The memory device 400 is similar to the memory device 100 in FIG. 1, and thus common features are labeled with the same reference numerals and need not be discussed. As illustrated in FIG. 4, instead of the switching layer 122 having a first portion overlying an upper surface of the first memory electrode 118 and a second portion overlying a sidewall of the first memory electrode 118, the switching layer 422 of the RRAM cell 404 may only overlay the upper surface of the first memory electrode 118.

FIG. 5 is a cross-sectional view of a semiconductor memory device 500, according to an alternative embodiment of the disclosure. The memory device 500 is similar to the memory device 100 in FIG. 1, and thus common features are labeled with the same reference numerals and need not be discussed. As illustrated in FIG. 5, an RRAM cell 504 may be shared between the first transistor 102 and a second transistor 502. The RRAM cell 504 may include a switching layer 522 overlying and in contact with an upper surface portion and a sidewall portion of the first memory electrode 118 (or the drain electrode 118 of the first transistor 102) and an upper surface portion and a sidewall portion of a first memory electrode 518 (or the drain electrode 518 of the second transistor 502). The switching layer 522 may have two substantially sharp corners providing two filament formation regions, each filament formation region to each of the transistors 102, 502. The configuration of the memory device 500 advantageously increases the device density of the memory device 500 by forming two memory devices having two transistors 102, 502 sharing the RRAM cell 504.

FIG. 6 is a cross-sectional view of a semiconductor memory device 600, according to an alternative embodiment of the disclosure. The memory device 600 is similar to the memory device 500 in FIG. 5, and thus common features are labeled with the same reference numerals and need not be discussed. As illustrated in FIG. 6, an RRAM cell 604 may have a switching layer 622 only overlaying the upper surfaces of the first memory electrodes 118, 518. The configuration of the memory device 600 advantageously increases the device density of the memory device 500 by forming two memory devices having two transistors 102, 502 sharing the RRAM cell 604.

As presented in the above disclosure, semiconductor memory devices having improved device performance with smaller footprints and methods of forming the same are presented. The memory device may include a dual-gate transistor and an RRAM cell. The dual-gate transistor may include a gate electrode stack having a first gate electrode and a second gate over the first gate electrode, and may further include a source electrode and a drain electrode at laterally opposite sides of the gate electrode stack.

The dual-gate transistor provides a larger drive current, thereby improving the access time of the memory device by at least two-fold than a typical single-gate transistor. Due to the deliverance of the larger drive current, the overall size of the dual-gate transistor may be advantageously reduced to deliver a substantially similar drive current to set the RRAM cell, saving valuable real estate on the semiconductor chip.

The RRAM cell may be coupled to the dual-gate transistor such that the drain electrode of the dual-gate transistor further functions as a bottom electrode for the RRAM cell. The RRAM cell further includes a top electrode over the bottom electrode and a switching layer interposed between the top and bottom electrodes.

The switching layer may overlay an upper surface and a sidewall portion of the bottom electrode (or the drain electrode of the dual-gate transistor) such that a filament formation region may be formed for the formation of substantially confined conductive filaments when the RRAM cell is set. The substantially confined region of conductive filaments advantageously reduces the variability of the switching layer in the FIRS state and provides improved high device-to-device control and cycle-to-cycle control.

The semiconductor memory device may be fabricated in the BEOL region of the semiconductor device to enable shorter wiring to the RRAM cell, thereby further advantageously reduces latency in programming speed of the memory device. The semiconductor memory device may be compatible with complementary metal-oxide-semiconductor (CMOS) processes.

The semiconductor memory devices disclosed in this present disclosure may be configured in a memory array having a cross-bar configuration, a three-dimensional (3D) configuration, combinations thereof, or any other configurations as known to those skilled in the art, to achieve high-density architecture with high parallel programming speed and low power consumption. For example, the 3D configuration may be achieved by repeating the memory device 100, 300, 400, 500, and 600 in FIGS. 1 and 3-6, respectively, or combinations thereof.

The terms "top", "bottom", "over", "under", and the like in the description and the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A memory device, comprising:
    a dual-gate transistor, the dual-gate transistor comprises:
        a gate electrode stack including:
            a first gate electrode; and
            a second gate electrode over the first gate electrode;
        a first gate dielectric layer over the first gate electrode, the first gate dielectric layer has a lowermost surface;
        a second gate dielectric layer interposed between the first gate dielectric layer and the second gate electrode;
        a source electrode; and
        a drain electrode, wherein the source electrode and the drain electrode are adjacent to the gate electrode stack at laterally opposite sides thereof and include lower surfaces substantially coplanar with the lowermost surface of the first gate dielectric layer; and
    a memory cell adjacent to the dual-gate transistor, wherein the memory cell and the dual-gate transistor share a common electrode.

2. The memory device of claim 1, wherein the drain electrode of the dual-gate transistor is the common electrode shared with the memory cell.

3. The memory device of claim 1, wherein the second gate dielectric layer conforms to a lower surface of the second gate electrode.

4. The memory device of claim 1, wherein the dual-gate transistor further comprises a channel layer interposed between the first gate dielectric layer and the second gate dielectric layer, and the channel layer conforms to an upper surface of the first gate dielectric layer.

5. The memory device of claim 4, wherein the source electrode and the drain electrode overlay portions of the channel layer and are separated from the second gate dielectric layer.

6. The memory device of claim 4, wherein the channel layer has a non-planar topography.

7. The memory device of claim 1, wherein the memory cell comprises:
    a first memory electrode, wherein the first memory electrode is the common electrode shared with the dual-gate transistor;
    a second memory electrode over the first memory electrode; and
    a switching layer interposed between the first memory electrode and second memory electrode, wherein the switching layer conforms to a lower surface of the second memory electrode.

8. The memory device of claim 7, wherein a portion of the switching layer is in contact with an upper surface portion of the first memory electrode.

9. The memory device of claim 7, wherein a portion of the switching layer is in contact with a sidewall portion of the first memory electrode.

10. The memory device of claim 7, wherein the switching layer is separated from the second gate dielectric layer of the dual-gate transistor.

11. The memory device of claim 1, wherein the source electrode and the drain electrode of the gate electrode stack are laterally adjacent to the first gate electrode at laterally opposite sides thereof.

12. The memory device of claim 11, wherein the first gate electrode comprises a lower surface, and the lower surface of the drain electrode is substantially coplanar with the lower surface of the first gate electrode.

13. A memory device, comprising:
    a dual-gate transistor, the dual-gate transistor comprises:
        a first gate electrode;
        a first gate dielectric layer over the first gate electrode, the first gate dielectric layer has a lowermost surface;
        a channel layer over the first gate electrode;
        a second gate dielectric layer over the channel layer, the second gate dielectric layer has an uppermost surface;
        a second gate electrode over the second gate dielectric layer, wherein the first gate electrode and the second gate electrode form a gate electrode stack;
        a source electrode adjacent to a first side of the gate electrode stack; and
        a drain electrode adjacent to a second side of the gate electrode stack, the second side being laterally opposite the first side, wherein the source electrode and drain electrode have lower surfaces substantially coplanar with the lowermost surface of the first gate dielectric layer; and
    a memory cell adjacent to the dual-gate transistor, the memory cell comprising:
        a first memory electrode;
        a switching layer coupled to the first memory electrode, the switching layer has an uppermost surface, and the uppermost surface of the switching layer is substantially coplanar with the uppermost surface of the second gate dielectric layer; and
        a second memory electrode coupled to the switching layer, wherein the first memory electrode is a drain electrode of the dual-gate transistor.

14. The memory device of claim 13, wherein the second gate electrode has an uppermost surface substantially coplanar with an uppermost surface of the second memory electrode.

15. The memory device of claim 13, wherein the switching layer of the memory cell has a lowermost surface below an upper surface of the first memory electrode.

16. A method of forming a memory device, comprising:
    forming a first gate electrode;
    forming a second gate electrode over the first gate electrode, wherein the first gate electrode and the second gate electrode form a gate electrode stack;
    forming a first gate dielectric layer over the first gate electrode, the first gate dielectric layer has a lowermost surface;
    forming a second gate dielectric layer interposed between the first gate dielectric layer and the second gate electrode;
    forming a source electrode; and
    forming a drain electrode, wherein the source electrode and the drain electrode are adjacent to the gate electrode stack at laterally opposite sides thereof and include lower surfaces substantially coplanar with the lowermost surface of the first gate dielectric layer, wherein the gate electrode stack, the first gate dielectric layer, the second gate dielectric layer, the source electrode, and the drain electrode form a dual-gate transistor; and
    forming a memory cell adjacent to the dual-gate transistor, wherein the memory cell and the dual-gate transistor share a common electrode.

17. The method of claim 16, wherein forming the memory cell comprises:
    forming a memory electrode concurrently with the second gate electrode of the dual-gate transistor, the memory electrode is over the drain electrode, and the drain electrode is the common electrode shared between the memory cell and the dual-gate transistor.

18. The method of claim 17, wherein forming the second gate dielectric layer comprising:
    depositing a dielectric material at least over the first gate dielectric layer, wherein a first portion of the dielectric material forms a switching layer of the memory cell, and a second portion of the dielectric material forms the second gate dielectric layer over the first gate dielectric layer, and the switching layer has an uppermost surface substantially coplanar with the uppermost surface of the second gate dielectric layer.

19. The method of claim 17, wherein forming the second portion of the dielectric material comprises forming a first portion overlying an upper surface portion of the drain electrode and a second portion overlying a sidewall portion of the drain electrode.

20. The method of claim 17, wherein the memory electrode is formed having an uppermost surface substantially coplanar with an uppermost surface of the second gate electrode.

* * * * *